(12) United States Patent
Shen et al.

(10) Patent No.: US 9,178,685 B1
(45) Date of Patent: Nov. 3, 2015

(54) TECHNIQUES TO DETERMINE SIGNAL TIMING

(71) Applicant: Altera Corporation, San Jose, CA (US)

(72) Inventors: Jie Shen, Fremont, CA (US); David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 202 days.

(21) Appl. No.: 14/142,546

(22) Filed: Dec. 27, 2013

(51) Int. Cl.
*G01R 25/00* (2006.01)
*H04L 7/00* (2006.01)

(52) U.S. Cl.
CPC .................................... *H04L 7/0037* (2013.01)

(58) Field of Classification Search
CPC .... G01R 25/00; H04L 7/0033; H04L 7/0037; H04L 7/0041
USPC ............. 324/76.77, 76.52, 76.54; 326/93–98; 327/149, 141, 144, 147, 156, 158
See application file for complete search history.

(56) References Cited

U.S. PATENT DOCUMENTS

| | | | |
|---|---|---|---|
| 4,451,782 A * | 5/1984 | Ashida .................... | G01R 27/28 324/76.26 |
| 6,859,027 B2 * | 2/2005 | Li ........................ | H03D 13/004 324/76.52 |
| 6,954,913 B2 | 10/2005 | Gauthier et al. | |
| 7,557,561 B2 * | 7/2009 | Awaji ................. | G01R 31/3016 324/76.52 |
| 8,334,716 B1 | 12/2012 | Davidson et al. | |
| 8,552,740 B2 | 10/2013 | Cheung et al. | |
| 2007/0217559 A1 * | 9/2007 | Stott ..................... | G11C 7/1051 375/355 |
| 2009/0146640 A1 * | 6/2009 | Nose ....................... | G01R 25/00 324/76.77 |
| 2012/0230135 A1 * | 9/2012 | Lin ........................ | H03L 7/0812 365/194 |
| 2012/0242385 A1 * | 9/2012 | Tokuhiro ............ | G06F 13/1689 327/158 |
| 2014/0139277 A1 * | 5/2014 | Subramanian ........ | H03L 7/0812 327/158 |
| 2014/0320181 A1 * | 10/2014 | Mitric ...................... | H03L 7/10 327/156 |

OTHER PUBLICATIONS

"Common Public Radio Interface (CPRI); Interface Specification," CPRI Specification V5.0 (Sep. 21, 2011), pp. 1-119.
U.S. Appl. No. 13/329,188, filed Dec. 16, 2011.

* cited by examiner

*Primary Examiner* — Arleen M Vazquez
*Assistant Examiner* — Steven Yeninas
(74) *Attorney, Agent, or Firm* — Steven J. Cahill (57) ABSTRACT

A measurement circuit includes a phase detection circuit and delay circuitry. The phase detection circuit compares a first signal to a second signal to generate a first phase difference when the delay circuitry generates the second signal based on the first signal. The phase detection circuit compares the first signal to the second signal to generate a second phase difference when the delay circuitry generates the second signal based on a third signal provided to a signal network. The measurement circuit determines a delay of the signal network based on the first and second phase differences.

21 Claims, 7 Drawing Sheets

TECHNIQUES TO DETERMINE SIGNAL TIMING

FIELD OF THE DISCLOSURE

The present disclosure relates to electronic circuits, and more particularly, to techniques for determining signal timing.

BACKGROUND

Many communication standards require high accuracy for the transmission of information from one device to another device. For example, the Common Public Radio Interface (CPRI) 5.0 standard has a round trip delay accuracy requirement for transmitting information between a radio base station and a remote radio unit of about 16 nanoseconds, excluding the round trip group delay on the transmission medium. High accuracy transmission of time information is used by many applications. As an example, the IEEE 1588 standards have accuracy requirements for transmitting time information from one device to another device in the range of 1 millisecond to sub-nanosecond.

BRIEF SUMMARY

According to some embodiments, a measurement circuit includes a phase detection circuit and delay circuitry. The phase detection circuit compares a first signal to a second signal to generate a first phase difference when the delay circuitry generates the second signal based on the first signal. The phase detection circuit compares the first signal to the second signal to generate a second phase difference when the delay circuitry generates the second signal based on a third signal provided to a signal network. The measurement circuit determines a delay of the signal network based on the first and second phase differences.

Various objects, features, and advantages of the present invention will become apparent upon consideration of the following detailed description and the accompanying drawings.

DETAILED DESCRIPTION

In many applications, it is useful to determine the propagation delay of a signal within an integrated circuit. For example, the propagation delay of a clock signal within an integrated circuit may generate a significant portion of the delay provided to time information that is transmitted according to one of the IEEE 1588 standards. Uncertainty in the delay provided to the time information during its transmission reduces the accuracy of the time information.

Figure 1A:
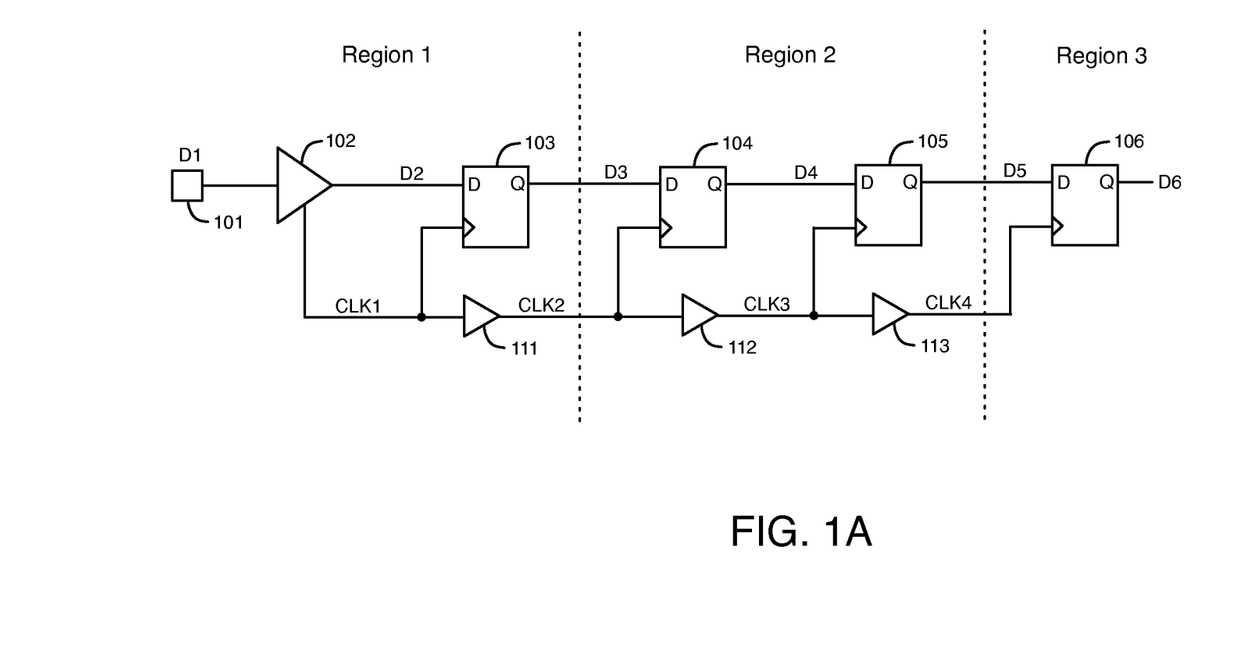
FIG. 1A illustrates examples of circuits in an integrated circuit that provide propagation delay to a clock signal and that can be used with embodiments of the present invention.

FIG. 1A illustrates examples of circuits in an integrated circuit that provide propagation delay to a clock signal and that can be used with embodiments of the present invention. FIG. 1A illustrates an external terminal 101, an input circuit 102, four D flip-flop circuits 103-106, and three buffer circuits 111-113. The integrated circuit receives a data signal D1 from an external device at external terminal 101. External terminal 101 may be an external terminal of the integrated circuit, such as a pad, or a pin connected to a package that houses the integrated circuit. The data signal D1 is provided to an input of input circuit 102. Input circuit 102 includes a buffer circuit that buffers data signal D1 to generate data signal D2.

In an exemplary embodiment, input circuit 102 also includes a clock data recovery circuit that generates a recovered clock signal CLK1 using the data signal D1 and a reference clock signal (not shown) generated by a phase-locked loop circuit. Recovered clock signal CLK1 is provided to a clock input of flip-flop circuit 103, and the data signal D2 is provided to the D input of flip-flop circuit 103. Flip-flop circuit 103 stores the value of data signal D2 at its Q output in data signal D3 in response to each rising edge of clock signal CLK1.

The recovered clock signal CLK1 is provided through a clock network that includes buffer circuits 111-113. Buffer circuit 111 buffers clock signal CLK1 to generate a buffered clock signal CLK2. Clock signal CLK2 is provided to a clock input of flip-flop circuit 104, and the data signal D3 is provided to the D input of flip-flop circuit 104. Flip-flop circuit 104 stores the value of data signal D3 at its Q output in data signal D4 in response to each rising edge of clock signal CLK2.

Buffer circuit 112 buffers clock signal CLK2 to generate a buffered clock signal CLK3. Clock signal CLK3 is provided to a clock input of flip-flop circuit 105, and the data signal D4 is provided to the D input of flip-flop circuit 105. Flip-flop circuit 105 stores the value of data signal D4 at its Q output in data signal D5 in response to each rising edge of clock signal CLK3.

Buffer circuit 113 buffers clock signal CLK3 to generate a buffered clock signal CLK4. Clock signal CLK4 is provided to a clock input of flip-flop circuit 106, and the data signal D5 is provided to the D input of flip-flop circuit 106. Flip-flop circuit 106 stores the value of data signal D5 at its Q output in data signal D6 in response to each rising edge of clock signal CLK4. In many embodiments, buffers 111, 112, and 113 may drive large clock trees rather than single registers.

The circuitry shown in FIG. 1A is in an integrated circuit that includes two or more regions and is illustrated with three regions 1, 2, and 3. As an example, the integrated circuit may be a field programmable gate array (FPGA), and the three regions 1, 2, and 3 shown in FIG. 1A may be a physical medium attachment (PMA) region, a physical coding sublayer (PCS) region, and an FPGA core region, respectively. The recovered clock signal may experience a significant propagation delay as it is transmitted through the clock network in the three regions 1-3. In an alternative embodiment, region 2 is omitted, and region 1 directly connects to region 3. For example, the entire PCS region may be part of region 3.

Figure 1B:
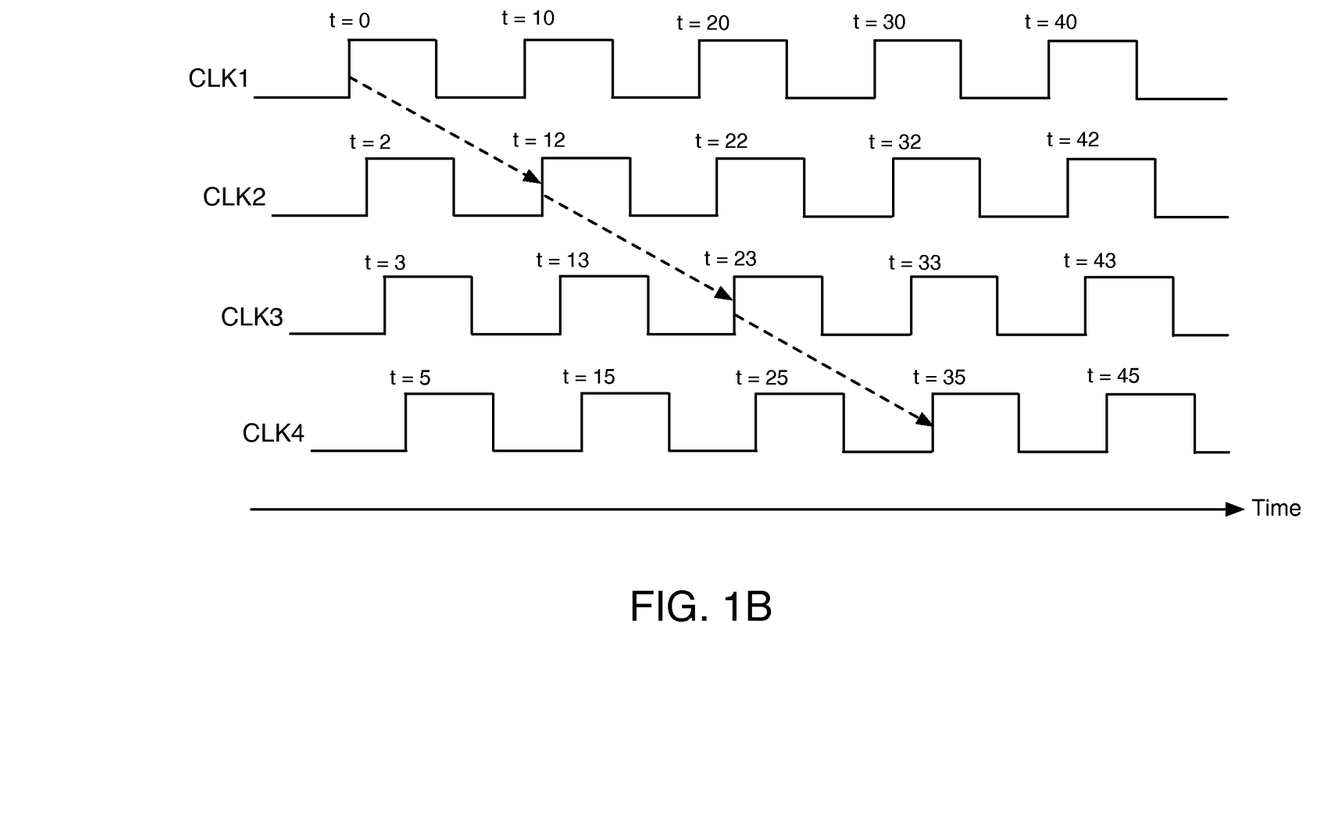
FIG. 1B is a timing diagram that shows examples of waveforms of the four clock signals shown in FIG. 1A.

FIG. 1B is a timing diagram that shows examples of waveforms of the four clock signals shown in FIG. 1A. In the example of FIG. 1B, each of the clock signals CLK1-CLK4 has a frequency of 100 megahertz (MHz) and a clock period of 10 nanoseconds (ns). In FIG. 1B, an exemplary data bit is stored by flip-flop circuit 103 in data signal D3 in response to a first rising edge in clock signal CLK1 that occurs at time t=0. Buffer circuit 111 and routing conductors in the clock network generate a delay of 2 ns in clock signal CLK2 relative to clock signal CLK1. Flip-flop circuit 104 stores the exemplary data bit received from data signal D3 in data signal D4 in response to a second rising edge in clock signal CLK2 that occurs at time t=12 ns, as shown by the first dotted arrow in FIG. 1B.

Buffer circuit 112 and routing conductors in the clock network generate a delay of 1 ns in clock signal CLK3 relative to clock signal CLK2. Flip-flop circuit 105 stores the exemplary data bit received from data signal D4 in data signal D5 in response to a third rising edge in clock signal CLK3 that occurs at time t=23 ns, as shown by the second dotted arrow in FIG. 1B. Buffer circuit 113 and routing conductors in the clock network generate a delay of 2 ns in clock signal CLK4 relative to clock signal CLK3. Flip-flop circuit 106 stores the exemplary data bit received from data signal D5 in data signal D6 in response to a fourth rising edge in clock signal CLK4 that occurs at time t=35 ns, as shown by the third dotted arrow in FIG. 1B.

In the example of FIG. 1B, the clock network adds a delay of 5 ns to clock signal CLK4 relative to clock signal CLK1. The delay that the clock network of FIG. 1A provides to clock signal CLK4 changes based on variations in the process of the integrated circuit, variations in the temperature of the integrated circuit, and variations in the supply voltage provided to the clock network (i.e., PVT variations). The delay that the clock network of FIG. 1A provides to clock signal CLK4 may vary significantly in response to PVT variations. As an example, in the embodiments of FIGS. 1A-1B, the clock network may provide a delay of 5 ns to clock signal CLK4 in integrated circuits having slow corner process variations, and the clock network may provide a delay of 2.5 ns to clock signal CLK4 in integrated circuits having fast corner process variations. Changes in the temperature and supply voltage may cause additional variations in the delay of the clock network.

The delay that the clock network provides to clock signal CLK4 is also added to the delay that flip-flop circuits 103-106 provide to data signal D6. The delay of the clock network and PVT variations in the delay of the clock network may reduce the accuracy of data signal D6. For example, if data signals D1-D6 indicate time information transmitted according to one of the IEEE 1588 standards, the delay provided to data signal D6 by the clock network and PVT variations in the delay of the clock network may reduce the accuracy of the time information below a required level. If the integrated circuit is a field programmable gate array (FPGA), the delay that a clock network provides to a clock signal may be significant, for example, within a high-speed serial interface (HSSI) circuit. Therefore, it would be desirable to accurately determine the delay of a signal network within an integrated circuit. It would also be desirable to determine the arrival time or phase of a signal at a starting point within an integrated circuit.

Figure 2:
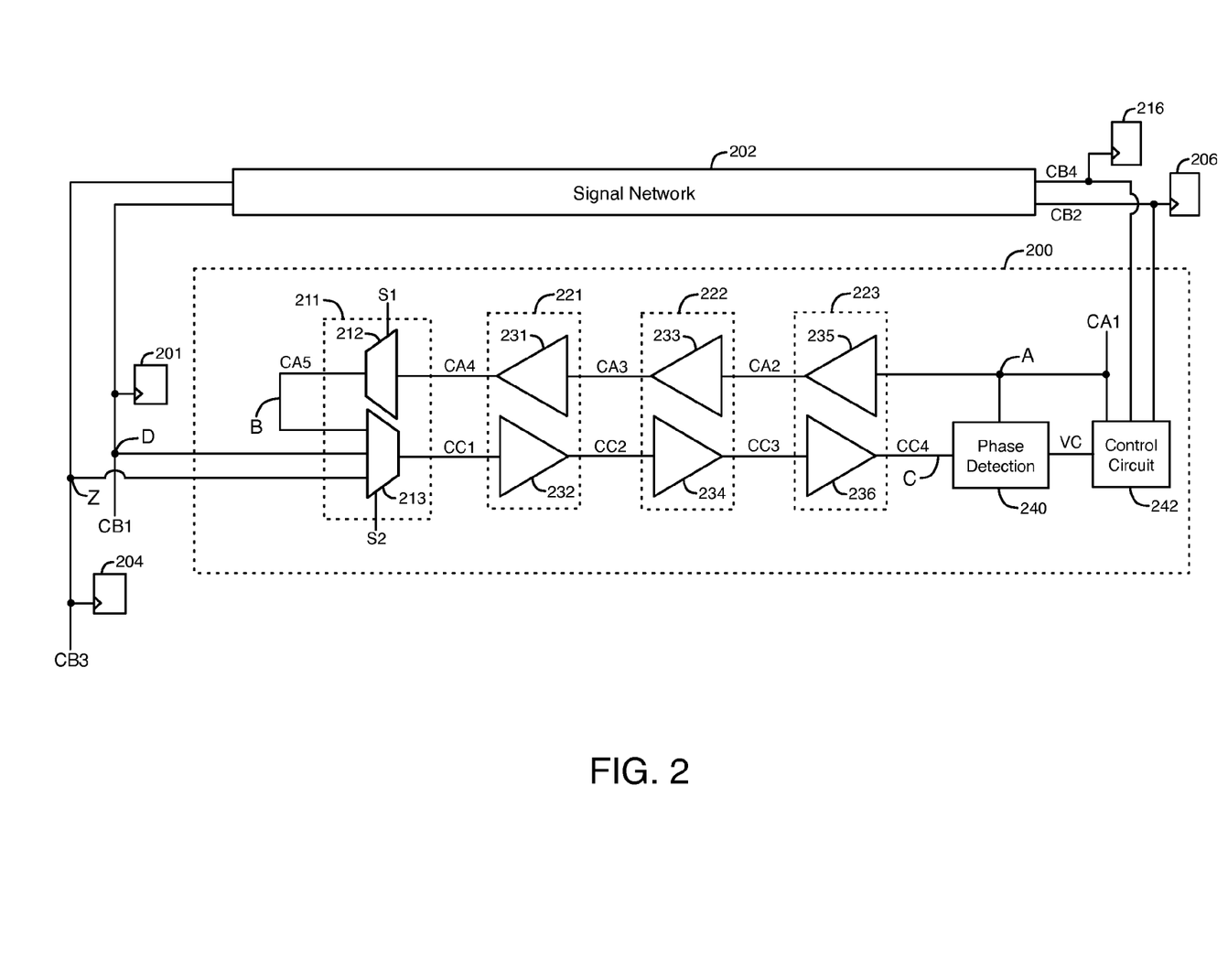
FIG. 2 illustrates an example of a measurement circuit that measures the delay of a signal network, according to an embodiment of the present invention.

FIG. 2 illustrates an example of a measurement circuit 200, according to an embodiment of the present invention. Measurement circuit 200 includes delay circuitry, phase detection circuit 240, and control circuit 242. The delay circuitry in measurement circuit 200 includes circuits 211 and 221-223. Circuit 211 includes multiplexer circuits 212-213. Circuits 221, 222, and 223 include buffer circuits 231-232, 233-234, and 235-236, respectively. The delay circuitry in measurement circuit 200 is coupled between the first and second inputs of phase detection circuit 240.

FIG. 2 also illustrates a signal network 202 and flip-flop circuits 201, 204, 206, and 216. In some embodiments, the circuits shown in FIG. 2 are in a single integrated circuit. In other embodiments, the circuits shown in FIG. 2 are in two or more integrated circuits coupled together, e.g., through a circuit board, interposer, or package.

FIG. 2 illustrates signals CA1-CA5, CB1-CB4, and CC1-CC4. CA1-CA5, CB1-CB4, and CC1-CC4 may be, for example, periodic clock signals, data signals, reset signals, strobe signals, or other types of signals. Signals CA1 and CC4 are provided to first and second inputs of phase detection circuit 240 at nodes A and C, respectively.

Signal CB1 is provided to an input of flip-flop circuit 201 at node D. In an embodiment, node D represents a starting point of signal CB1 within the circuitry shown in FIG. 2. Signal CB3 is provided to an input of flip-flop circuit 204 at node Z. In an embodiment, node Z represents a starting point of signal CB3 within the circuitry shown in FIG. 2. The starting point is a physical location from which measurement circuit 200 determines time information for the measured signal. The starting point may be any physical location from which the measurement circuit determines time information for the measured signal. The time information may be, for example, information indicating a time when a particular edge or transition occurred in the measured signal, such as a phase of the measured signal.

As an example, either one or both of signals CB1 and CB3 may be an input signal transmitted from an external device to an input pad of the integrated circuit, and the respective flip-flop circuit 201 or 204 may be the closest flip-flop to the input pad. As another example, either one or both of signals CB1 and CB3 may be a clock signal generated by a clock signal generation circuit in an integrated circuit that contains the circuitry of FIG. 2. As a more specific example, signals CA1-CA5, CB1-CB4, and CC1-CC4 are all clock signals. Flip-flop circuits 201 and 204 may be in one or more clock signal generation circuits that generate clock signals CB1 and CB3 or coupled to outputs of the one or more clock signal generation circuits that generate clock signals CB1 and CB3. The one or more clock signal generation circuits that generate signals CB1 and CB3 may be, for example, one or more clock data recovery circuits, one or more phase-locked loop circuits, one or more delay-locked loop circuits, and/or one or more counter circuits. In an exemplary embodiment, signal CB1 is a clock signal that is used to capture incoming data in a receiver, and signal CB3 is a clock signal that is used to transmit outgoing data in a transmitter.

Signal network 202 generates signal CB2 based on signal CB1. Signal network 202 generates signal CB4 based on signal CB3. Signal network 202 may, for example, include buffer circuits that buffer signal CB1 to generate signal CB2 and that buffer signal CB3 to generate signal CB4. Signal CB2 is provided to an input of flip-flop circuit 206. Signal CB4 is provided to an input of flip-flop circuit 216. In an exemplary embodiment, signals CB1-CB4 are periodic clock signals, and signal network 202 is a clock network, such as the clock network of FIG. 1A.

Signal network 202 may drive signals CB2 and CB4 and other signals generated based on signals CB1 and CB3 to numerous destination circuits, such as flip-flop circuits and other digital logic circuitry. In other embodiments, signal network 202 generates additional output signals based on additional input signals not shown in FIG. 2. If signal network 202 has a large fan-out to many destination circuits, then signal network 202 may provide a substantial delay to signal CB2 relative to signal CB1 and a substantial delay to signal CB4 relative to signal CB3. As described in further detail below, measurement circuit 200 determines time information for signal CB1 at node D and then uses the time information for signal CB1 to calculate the delay that signal network 202 provides to signal CB2 relative to signal CB1. Measurement circuit 200 can also determine time information for signal CB3 at node Z and use the time information for signal CB3 to calculate the delay that signal network 202 provides to signal CB4 relative to signal CB3. According to some embodiments that are not intended to be limiting, a measurement of the delay of signal network 202 may, for example, be used to more accuracy determine the values of information transmitted within an integrated circuit according to one of the IEEE 1588 standards or one of the CPRI standards.

In some embodiments, measurement circuit 200 provides a relatively small amount of additional delay to signals CB2 and CB4 and to signal network 202. Measurement circuit 200 can measure time information for signals CB1 and CB3 and the delays of signal network 202 during the normal operation of signal network 202. In some embodiments, measurement circuit 200 periodically updates the measurements of time information for signals CB1 and CB3 and the delays of signal network 202 during the normal operation of signal network 202.

Figure 3:
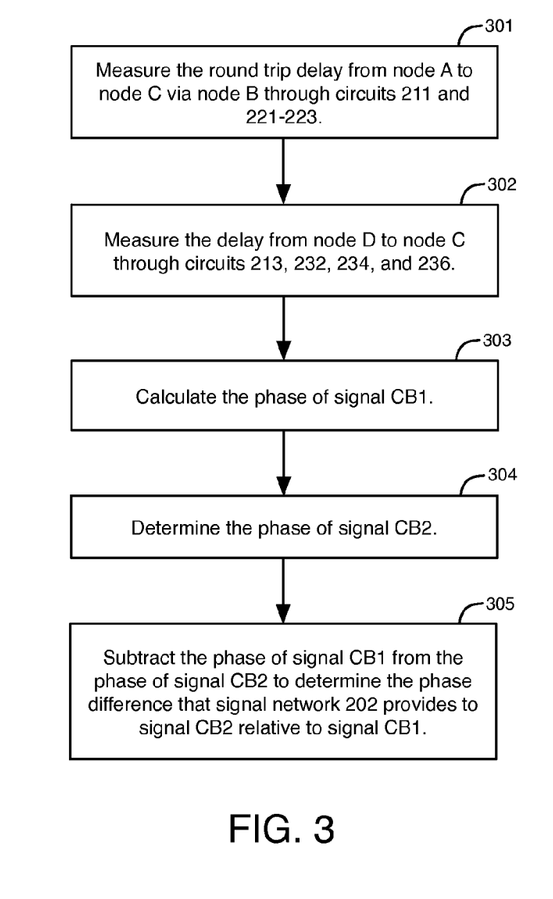
FIG. 3 illustrates examples of operations that can be used by the measurement circuit of FIG. 2 to determine the delay of the signal network of FIG. 2, according to an embodiment of the present invention.

FIG. 3 illustrates examples of operations that can be used by measurement circuit 200 to determine the delay that signal network 202 provides to signal CB2 relative to signal CB1, according to an embodiment of the present invention. In operation 301, control circuit 242 measures the round trip delay DABC from node A to node C via node B through the delay circuitry 211 and 221-223. Signal CA1 is provided through a conductor to the input of buffer circuit 235 as shown in FIG. 2. In an embodiment, signal CA1 has the same frequency as signal CB1 during the measurement of the delay that signal network 202 provides to signal CB2 relative to signal CB1. Signal CA1 may be generated based on signal CB1 or based on another signal. As an example, one or more buffer circuits buffer signal CB1 to generate signal CA1. In other embodiments, signal CA1 may have a different frequency than signal CB1 during the measurement of the delay that signal network 202 provides to signal CB2 relative to signal CB1. In some embodiments, signal CB1 is generated independently from signal CA1, such that signal CB1 is not derived from signal CA1.

Buffer circuit 235 buffers signal CA1 to generate signal CA2 at its output. Signal CA2 is provided through a conductor to the input of buffer circuit 233. Buffer circuit 233 buffers signal CA2 to generate signal CA3 at its output. Signal CA3 is provided through a conductor to the input of buffer circuit 231. Buffer circuit 231 buffers signal CA3 to generate signal CA4 at its output. Signal CA4 is provided through a conductor to a multiplexing input of multiplexer circuit 212. Multiplexer circuit 212 is configured by select signal 51 to generate signal CA5 at node B based on signal CA4. Multiplexer circuit 212 functions as a buffer circuit that buffers signal CA4 to generate signal CA5. Multiplexer circuit 212 is added to measurement circuit 200 to match the delay of multiplexer circuit 213. In an alternative embodiment, multiplexer circuit 212 is replaced with a standard buffer circuit that buffers signal CA4 to generate signal CA5.

Signal CA5 is provided through a conductor to a first multiplexing input of multiplexer circuit 213. During the measurement of the delay DABC from node A to node C via node B, multiplexer circuit 213 is configured by select signals S2 to generate signal CC1 at its output based on signal CA5. Multiplexer circuit 213 buffers signal CA5 to generate signal CC1 during the measurement of the delay DABC. Signal CC1 is provided through a conductor to the input of buffer circuit 232. Buffer circuit 232 buffers signal CC1 to generate signal CC2. Signal CC2 is provided through a conductor to the input of buffer circuit 234. Buffer circuit 234 buffers signal CC2 to generate signal CC3. Signal CC3 is provided through a conductor to the input of buffer circuit 236. Buffer circuit 236 buffers signal CC3 to generate signal CC4.

Signal CA1 is provided through a conductor to a first input of phase detection circuit 240. Signal CC4 is provided through a conductor to a second input of phase detection circuit 240. Phase detection circuit 240 compares the phase of signal CA1 to the phase of signal CC4 to generate one or more phase comparison signals VC. The one or more phase comparison signals VC indicate a first phase difference PD1 between signals CA1 and CC4. The first phase difference PD1 indicates the delay DABC from node A to node C via node B, because multiplexer circuit 213 causes signal CC4 to be generated based on signal CA1 during the measurement of the first phase difference PD1. VC may be an analog signal or multiple digital signals. The one or more phase comparison signals VC are provided through one or more conductors to control circuit 242. Control circuit 242 includes a storage circuit that stores the first phase difference PD1 indicated by the one or more phase comparison signals VC.

Phase detection circuit 240 may be any suitable type of phase detection circuit. As an example that is not intended to be limiting, phase detection circuit 240 may include the phase detection circuitry shown in and described with respect to FIG. 2 of U.S. Pat. No. 8,334,716, issued Dec. 18, 2012, which is incorporated by reference herein in its entirety.

Circuits 211 and 221-223 ideally provide a symmetric delay to signal CC4 relative to signal CA1. Thus, the delay that buffer circuits 235, 233, and 231 and multiplexer circuit 212 provide to signal CA5 relative to signal CA1 ideally equals or approximately equals the delay that multiplexer circuit 213 and buffer circuits 232, 234, and 236 provide to signal CC4 relative to signal CA5. If the delay provided to signal CC4 relative to signal CA1 is symmetric, then one-half of the delay DABC from node A to node C via node B equals or approximately equals the delay DBC from node B to node C. Also, one-half of the delay DABC from node A to node C via node B equals or approximately equals the delay DDC from node D to node C.

In some embodiments, multiplexer circuit 212 is designed to have the same architecture and the same size transistors as multiplexer circuit 213, and buffer circuits 231, 233, and 235 are designed to have the same architectures and the same size transistors as buffer circuits 232, 234, and 236, respectively, in order to generate a symmetric delay in signal CC4 relative to signal CA1. In some embodiments, circuits 212, 231, 233, and 235 are located next to or near circuits 213, 232, 234, and 236 within circuits 211, 221, 222, and 223, respectively, to provide spatial correlation. In some embodiments, circuits 211, 221, 222, and 223 are all in the same integrated circuit. In these embodiments, circuits 212, 231, 233, and 235 have the same or nearly the same process, supply voltage, and temperature variations (i.e., PVT variations) as circuits 213, 232, 234, and 236, respectively.

In operation 302 shown in FIG. 3, control circuit 242 measures the delay DDC from node D to node C through circuits 213, 232, 234, and 236. Operation 302 is performed after operation 301 in FIG. 3. In an alternative embodiment, operation 302 is performed before operation 301. During the measurement of the delay DDC from node D to node C, multiplexer circuit 213 is configured by select signals S2 to generate signal CC1 at its output based on signal CB1 at node D. Node D is coupled to a second multiplexing input of multiplexer circuit 213. Multiplexer circuit 213 buffers signal CB1 to generate signal CC1 during the measurement of the delay DDC from node D to node C. Buffer circuit 232 buffers signal CC1 to generate signal CC2. Buffer circuit 234 buffers signal CC2 to generate signal CC3. Buffer circuit 236 buffers signal CC3 to generate signal CC4.

During the measurement of the delay DDC from node D to node C, phase detection circuit 240 compares the phase of signal CA1 to the phase of signal CC4 to generate one or more second values of the one or more phase comparison signals VC. The one or more second values of the one or more phase comparison signals VC indicate a second phase difference PD2 between signals CA1 and CC4. The second phase difference PD2 indicates the delay DDC from node D to node C, because multiplexer circuit 213 causes signal CC4 to be generated based on signal CB1 during the measurement of the second phase difference PD2. Control circuit 242 stores the second phase difference PD2 indicated by the one or more phase comparison signals VC.

Control circuit 242 then calculates time information for signal CB1 at node D using the first phase difference PD1 and the second phase difference PD2. The time information for signal CB1 may be, for example, the phase of signal CB1 relative to the phase of signal CA1. In an embodiment, the time period between the measurement of the first phase difference PD1 and the measurement of the second phase difference PD2 is short to increase the accuracy of the calculation of the time information for signal CB1 at node D. The first phase difference PD1 indicates the round trip delay DABC from node A to node C via node B through circuits 211 and 221-223, as shown in equation (1) below. In equation (1), PCC41 is the phase of signal CC4 during the measurement of the delay DABC, and PCA1 is the phase of signal CA1. As shown in equation (1), the first phase difference PD1 equals the phase PCC41 of signal CC4 minus the phase PCA1 of signal CA1. The phase PCC41 of signal CC4 during the measurement of delay DABC equals the phase PCA1 of signal CA1 plus the delay DABC (i.e., PCC41=PCA1+DABC).

$$PD1=PCC41-PCA1=(PCA1+DABC)-PCA1=DABC \quad (1)$$

The second phase difference PD2 indicates the phase PCB1 of signal CB1 plus the delay DDC from node D to node C through circuits 213, 232, 234, and 236, as shown in equation (2) below. In equation (2), PCC42 is the phase of signal CC4 during the measurement of the delay DDC from node D to node C, and PCA1 is the phase of signal CA1. As shown in equation (2), the second phase difference PD2 equals the phase PCC42 of signal CC4 minus the phase PCA1 of signal CA1. The phase PCC42 of signal CC4 during the measurement of the delay DDC from node D to node C equals the phase PCB1 of signal CB1 plus the delay DDC (i.e., PCC42=PCB1+DDC).

$$PD2=PCC42-PCA1=(PCB1+DDC)-PCA1 \quad (2)$$

If circuits 211 and 221-223 have a symmetric delay, then the delay DABC from node A to node C via node B through circuits 211 and 221-223 equals or nearly equals twice the delay DBC from node B to node C through circuits 213, 232, 234, and 236. If circuits 211 and 221-223 have a symmetric delay, and if the delay from node B through multiplexer circuit 213 equals the delay from node D through multiplexer circuit 213, then the delay DDC equals the delay DBC, and the delay DABC is twice the delay DDC (i.e., DABC=2×DDC). Substituting DABC=2×DDC into equation (1) generates DDC=PD1÷2. Substituting DDC=PD1÷2 into equation (2) generates equation (3) shown below.

$$PCB1=PD2-(PD1\div2)+PCA1 \quad (3)$$

Signal CA1 is the reference signal for phase detection circuit 240. Therefore, if the phase PCA1 of signal CA1 is set to 0 in equation (3), then equation (3) is simplified to equation (4), as shown below.

$$PCB1=PD2-(PD1\div2) \quad (4)$$

In operation 303, control circuit 242 calculates the phase PCB1 of signal CB1 by substituting the measured values of the first phase difference PD1 and the second phase difference PD2 into equation (3) or equation (4). The phase PCB1 of signal CB1 is the time information for signal CB1 in this embodiment. If control circuit 242 uses equation (4), then control circuit 242 determines the phase of signal CB1 relative to the phase of signal CA1. If control circuit 242 uses equation (3), then PCA1 may remain an unknown variable that is canceled out when PCB1 is subtracted from the phase PCB2 of signal CB2 as described below.

Signal CA1 and signal CB2 are also provided to inputs of control circuit 242. In operation 304 in FIG. 3, control circuit 242 determines the phase PCB2 of signal CB2. In operation 305, control circuit 242 then subtracts the phase PCB1 of signal CB1 calculated using equation (4) from the phase PCB2 of signal CB2 to determine the phase difference that signal network 202 provides to signal CB2 relative to signal CB1.

In some exemplary embodiments, operations 301-305 may be performed in two or more iterations to determine two or more values of the phase difference that signal network 202 provides to signal CB2 relative to signal CB1. An average value is then calculated for the two or more values determined for the phase difference that signal network 202 provides to signal CB2 relative to signal CB1. The average value may indicate a more accurate measurement of the phase difference that signal network 202 provides to signal CB2 relative to signal CB1.

In an exemplary embodiment, control circuit 242 includes a phase detection circuit that compares the phase PCA1 of signal CA1 to the phase PCB2 of signal CB2 to generate a third phase difference PD3. The third phase difference PD3 indicates the phase PCB2 of signal CB2 minus the phase of signal CA1 (i.e., PD3=PCB2−PCA1). Control circuit 242 then subtracts the phase PCB1 of signal CB1 calculated using equation (3) from the phase PCB2 of signal CB2 (i.e., PCB2=PD3+PCA1) to generate the phase difference PD4 that signal network 202 provides to signal CB2 relative to signal CB1 (i.e., PD4=PCB2−PCB1=(PD3+PCA1)−(PD2−(PD1÷2)+PCA1)=PD3−PD2+(PD1÷2)).

Subtracting the phase PCB1 of signal CB1 from the phase PCB2 of signal CB2 generates the delay that signal network 202 provides to signal CB2 relative to signal CB1 if the delay that signal network 202 provides to signal CB2 relative to signal CB1 is less than the period of signal CB1. If the delay that signal network 202 provides to signal CB2 relative to signal CB1 is greater than the period of signal CB1, then control circuit 242 may add an appropriate number of periods of signal CB2 to the calculated phase PCB2 of signal CB2 to determine the delay that signal network 202 provides to signal CB2 relative to signal CB1.

If the uncertainty in the delay of signal network 202 is greater than one period of the signal to be measured, a frequency divider circuit can be added to the circuitry of FIG. 2. The frequency divider circuit divides the frequency of the signal to be measured by a number N that is greater than 1

(e.g., N equals 2 or 4) to generate a frequency divided signal at node D. The measurement circuit 200 then determines the phase of the frequency divided signal at node D, as described above.

Measurement circuit 200 can determine the phase difference that signal network 202 provides to signal CB2 relative to signal CB1 if there is a known asymmetry in circuits 211 and 221-223. As an example, if the delay DAB through circuits 235, 233, 231, and 212 from node A to node B is an X amount of time plus a multiple of Y longer than the delay DBC through circuits 213, 232, 234, and 236 from node B to node C, then the delay DAB is shown by equation (5) below.

$$DAB = X + (Y \times DBC) \quad (5)$$

The time delay X may, for example, be caused by an extra buffer circuit and may be positive or negative. The multiple Y may, for example, be a slower conductor. In this example, X and Y are constants that are known prior to the measurement of the delay through signal network 202. Constants X and Y are stored in control circuit 242 or provided to control circuit 242. If circuits 211 and 221-223 are symmetric, then X=0, and Y=1.

The delay DABC through circuits 211 and 221-223 from node A to node C via node B equals the delay DAB from node A to node B plus the delay DBC from node B to node C. Equation (5) can be used to substitute for DAB to generate equation (6), which is simplified to generate equation (7) below.

$$DABC = DAB + DBC = X + (Y \times DBC) + DBC \quad (6)$$

$$DBC = (DABC - X)/(1+Y) \quad (7)$$

The phase PCB1 of signal CB1 equals the phase PCC42 of signal CC4 minus the delay DDC from node D to node C during the measurement of the delay from node D to node C, as described above. If the delay DDC equals the delay DBC from node B to node C, then equation (7) can be used to generate equation (8) as shown below.

$$PCB1 = PCC42 - DDC = PCC42 - (DABC - X)/(1+Y) \quad (8)$$

As described above, the delay DABC equals the phase PCC41 of signal CC4 minus the phase PCA1 of signal CA1 during the measurement of the round trip delay from node A to node C. The phase PCA1 of signal CA1 is set to 0 to generate a simplified equation (9) below. If PCA1 equals 0, then DABC equals PCC41, PCC41 equals PD1 from equation (1), and PD2 equals PCC42 from equation (2). In an embodiment, control circuit 242 uses equation (9) to calculate the phase PCB1 of signal CB1.

$$PCB1 = PD2 - (PD1 - X)/(1+Y) \quad (9)$$

Measurement circuit 200 can also determine time information for signal CB3 at node Z and use the time information for signal CB3 to calculate the delay that signal network 202 provides to signal CB4 relative to signal CB3. To determine the time information for signal CB3, control circuit 242 measures a first phase difference PD1 that equals the round trip delay DABC from node A to node C via node B, as described above and shown in equation (1).

Signal CB3 is provided to a third multiplexing input of multiplexer circuit 213. In an embodiment, signal CA1 has the same frequency as signal CB3 during the measurement of the time information for signal CB3. Signal CA1 may be generated based on signal CB3 or based on another signal. As an example, one or more buffer circuits buffer signal CB3 to generate signal CA1. In other embodiments, signal CA1 may have a different frequency than signal CB3 during the measurement of the time information for signal CB3. In some embodiments, signal CB3 is generated independently of signal CA1, such that signal CB3 is not derived from signal CA1.

To determine the time information for signal CB3, control circuit 242 also measures a fifth phase difference PD5 that indicates the delay from node Z to node C. To measure the fifth phase difference PD5, select signals S2 are set to values that cause multiplexer circuit 213 to generate signal CC1 based on signal CB3. Control circuit 242 then determines the fifth phase difference PD5 using equation (10) below. In equation (10), PCC43 is the phase of signal CC4 during the measurement of the delay from node Z to node C, PCB3 is the phase of signal CB3, DZC is the delay from node Z to node C, and PCA1 is the phase of signal CA1.

$$PD5 = PCC43 - PCA1 = (PCB3 + DZC) - PCA1 \quad (10)$$

If circuits 211 and 221-223 have a symmetric delay, and if the delay from node B through multiplexer circuit 213 equals the delay from node Z through multiplexer circuit 213, then the delay DZC equals the delay DBC, and DABC=2×DZC. Substituting DABC=2×DZC into equation (1) generates DZC=PD1÷2. Substituting DZC=PD1÷2 into equation (10) generates equation (11) shown below. Equation (11) indicates the phase PCB3 of signal CB3, which is the time information for signal CB3 in this embodiment.

$$PCB3 = PD5 - (PD1 \div 2) + PCA1 \quad (11)$$

Control circuit 242 then determines the phase PCB4 of signal CB4. Control circuit 242 then determines the delay that signal network 202 provides to signal CB4 relative to signal CB3 by subtracting the phase PCB4 of signal CB4 from the phase PCB3 of signal CB3. If the delay that signal network 202 provides to signal CB4 relative to signal CB3 is greater than the period of signal CB3, then control circuit 242 may add an appropriate number of periods of signal CB4 to the calculated phase PCB4 of signal CB4 to determine the delay that signal network 202 provides to signal CB4 relative to signal CB3. According to additional embodiments, multiplexer circuit 213 may have four or more multiplexing inputs that receive one or more additional measured signals. In these embodiments, the round trip delay from node A to node C is determined as described above, and the delay from the measured signal is also determined after multiplexer circuit 213 is configured to select the measured signal.

Figure 4:
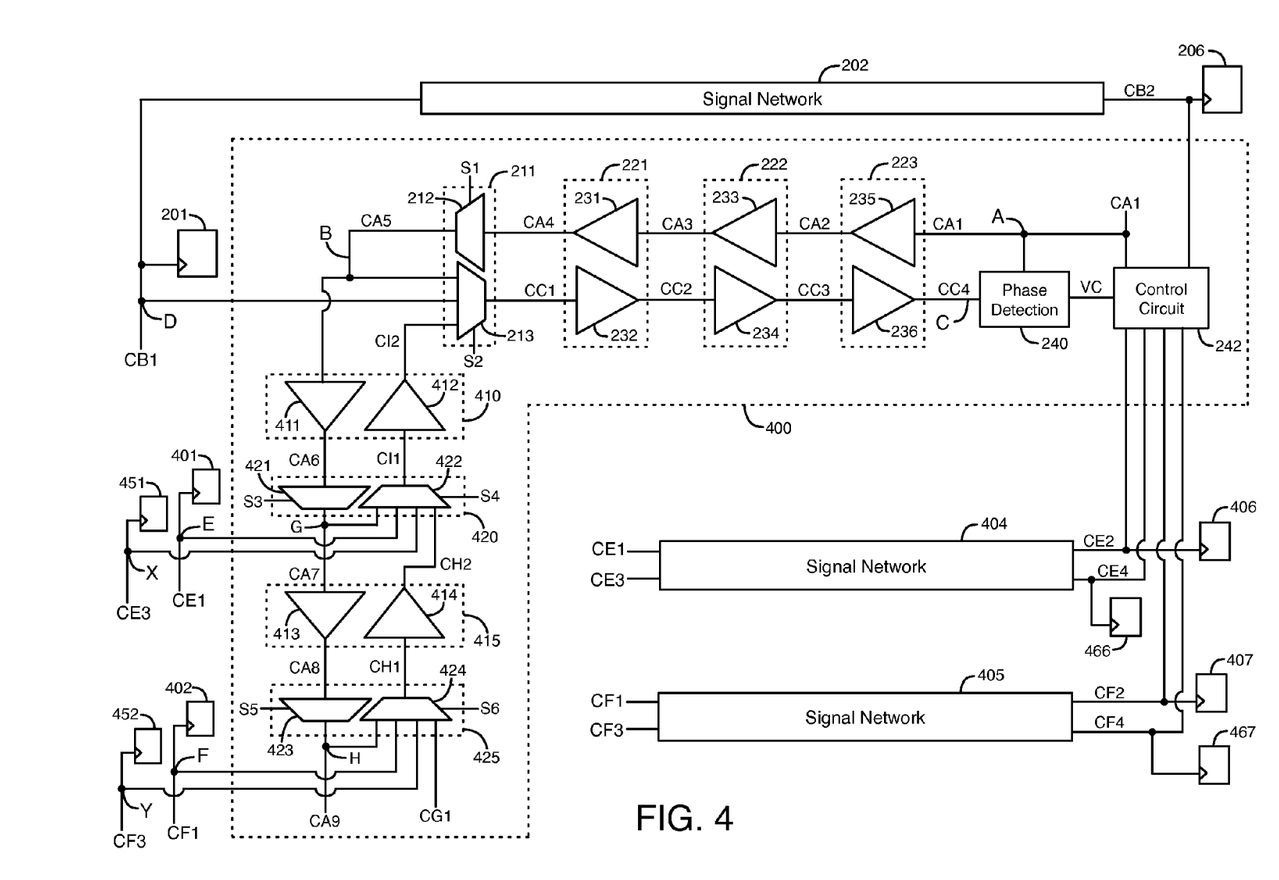
FIG. 4 illustrates an example of a measurement circuit that measures the delays of signal networks, according to another embodiment of the present invention.

FIG. 4 illustrates another example of a measurement circuit 400, according to an embodiment of the present invention. Measurement circuit 400 includes delay circuitry, phase detection circuit 240 and control circuit 242. The delay circuitry in measurement circuit 400 includes circuits 211, 221-223, 410, 415, 420, and 425. The delay circuitry is coupled between the first and second inputs of phase detection circuit 240. Circuits 410 and 415 include buffer circuits 411-412 and 413-414, respectively. Circuits 420 and 425 include multiplexer circuits 421-422 and 423-424, respectively.

Multiplexer circuits 421-424 and buffer circuits 411-414 extend the delay circuitry of FIG. 2 so that measurement circuit 400 can measure time information for additional signals CE1, CE3, CF1, and CF3. FIG. 4 also illustrates signal networks 202, 404, and 405 and flip-flop circuits 201, 206, 401-402, 406-407, 451-452, and 466-467. The circuits shown in FIG. 4 may be in a single integrated circuit or in multiple integrated circuits.

FIG. 4 illustrates signals CA1-CA9, CB1-CB2, CC1-CC4, CE1-CE4, CF1-CF4, CG1, CH1-CH2, and CI1-CI2. Signals CA1-CA9, CB1-CB2, CC1-CC4, CE1-CE4, CF1-CF4, CG1, CH1-CH2, and CI1-CI2 may be, for example, periodic clock signals, data signals, reset signals, strobe signals, or other types of signals in the embodiment of FIG. 4.

Signals CB1, CE1, CF1, CE3, and CF3 are provided to inputs of flip-flop circuits 201, 401, 402, 451, and 452 at nodes D, E, F, X, and Y, respectively. One or more of signals CB1, CE1, CF1, CE3, and CF3 may, for example, be clock signals generated by one or more clock signal generation circuits. As a more specific example, signals CA1-CA9, CB1-CB2, CC1-CC4, CE1-CE4, CF1-CF4, CG1, CH1-CH2, and CI1-CI2 are all clock signals. The one or more clock signal generation circuits that generate signals CB1, CE1, CF1, CE3, and CF3 may be, for example, clock data recovery circuits, phase-locked loop circuits, delay-locked loop circuits, counter circuits, or any combination of these types of circuits.

In an embodiment, flip-flop circuits 201 and 204, 401 and 451, and 402 and 452 are part of three different data channels in an interface circuit (e.g., a high-speed serial interface). Flip-flop circuits 201 and 204 are in a first data channel, flip-flop circuits 401 and 451 are in a second data channel, and flip-flop circuits 402 and 452 are in a third data channel. Each of the three data channels receives and/or transmits data. In this embodiment, signals CB1 and CB3, CE1 and CE3, and CF1 and CF3 are used in the three data channels to transmit and/or receive data. In an embodiment, signals CE1 and CF1 are clock signals used to receive data in the second and third channels, and signals CE3 and CF3 are clock signals used to transmit data in the second and third channels, respectively.

Signal network 404 generates signals CE2 and CE4 based on signals CE1 and CE3, respectively. Signal network 405 generates signals CF2 and CF4 based on signals CF1 and CF3, respectively. Signal networks 404-405 may, for example, each have serially coupled buffer circuits that buffer signals CE1, CE3, CF1, and CF3 to generate signals CE2, CE4, CF2, and CF4, respectively. Signals CE2, CE4, CF2, and CF4 are provided to inputs of flip-flop circuits 406, 466, 407, and 467, respectively. In an exemplary embodiment, signals CE1-CE4 and CF1-CF4 are periodic clock signals, and signal networks 404-405 are clock networks.

Measurement circuit 400 can determine time information for each of signal CB1 at node D, signal CE1 at node E, signal CE3 at node X, signal CF1 at node F, and signal CF3 at node Y at different times. Measurement circuit 400 uses the time information determined for signals CB1, CE1, CE3, CF1, and CF3 to determine the delays that signal networks 202, 404, and 405 provide to signals CB2, CE2, CE4, CF2, and CF4 relative to signals CB1, CE1, CE3, CF1, and CF3, respectively. Measurement circuit 400 can determine the delay that signal network 202 provides to signal CB4 using the techniques described above with respect to FIG. 2. Signals CB3-CB4 are not shown in FIG. 4 merely to simplify the drawing.

In an embodiment, signal CA1 is set to have the same frequency as signal CB1 when measurement circuit 400 is determining the time information for signal CB1. In an embodiment, signal CA1 is set to have the same frequency as signal CE1 when measurement circuit 400 is determining the time information for signal CE1. In an embodiment, signal CA1 is set to have the same frequency as signal CE3 when measurement circuit 400 is determining the time information for signal CE3. In an embodiment, signal CA1 is set to have the same frequency as signal CF1 when measurement circuit 400 is determining the time information for signal CF1. In an embodiment, signal CA1 is set to have the same frequency as signal CF3 when measurement circuit 400 is determining the time information for signal CF3. According to an exemplary embodiment, signal CA1 may be generated based on the measured signal CB1, CE1, CE3, CF1, or CF3 for example, using a multiplexer circuit that selects the measured signal and buffer circuits that buffer the selected measured signal to generate signal CA1. According to another exemplary embodiment, signal CA1 may be generated based on one or more other signals that are not directly derived from the measured signal CB1, CE1, CF1, or CF3. According to other embodiments, signal CA1 may have a different frequency than the measured signal CB1, CE1, CE3, CF1, or CF3. In some embodiments, measured signals CB1, CE1, CE3, CF1, and CF3 are generated independently of signal CA1, such that signals CB1, CE1, CE3, CF1, and CF3 are not derived from signal CA1.

In order to determine the delay that signal network 404 provides to signal CE2 relative to signal CE1, signal CA1 is set to have the same frequency as signal CE1 in some embodiments, and measurement circuit 400 determines the phase of signal CE1 relative to the phase of signal CA1. To determine the phase of signal CE1 relative to signal CA1, control circuit 242 measures the round trip delay from node A to node C via node B and node G through circuits 211, 221-223, 410, and 420.

Circuits 211, 221-223, 410, and 420 ideally provide a symmetric delay to signal CC4 relative to signal CA1, such that one-half of the delay from node A to node C via nodes B and G equals or approximately equals the delay from node E to node C. In some embodiments, multiplexer circuit 421 has the same architecture and the same size transistors as multiplexer circuit 422, and buffer circuit 411 has the same architecture and the same size transistors as buffer circuit 412. In some embodiments, circuits 411 and 421 are located next to or near circuits 412 and 422 within circuits 410 and 420, respectively. In some embodiments, circuits 211, 221-223, 410, and 420 are in the same integrated circuit.

Buffer circuit 411 buffers signal CA5 to generate signal CA6. During the measurement of the delay from node A to node C via nodes B and G, multiplexer circuit 421 is configured by select signal S3 to generate signal CA7 based on signal CA6. Multiplexer circuit 421 buffers signal CA6 to generate signal CA7 at its output. Signal CA7 is provided to a first multiplexing input of multiplexer circuit 422. Multiplexer circuit 422 is configured by select signals S4 to generate signal CI1 based on signal CA7 during the measurement of the delay from node A to node C via nodes B and G. Multiplexer circuit 422 buffers signal CA7 to generate signal CI1 at its output. Buffer circuit 412 buffers signal CI1 to generate signal CI2 at its output.

Signal CI2 is provided to a fourth multiplexing input of multiplexer circuit 213. Multiplexer circuit 213 is configured by select signals S2 to generate signal CC1 based on signal CI2 during the measurement of the delay from node A to node C via nodes B and G. Multiplexer circuit 213 buffers signal CI2 to generate signal CC1. Buffer circuits 232, 234, and 236 generate signal CC4 based on signal CC1, as described above. Phase detection circuit 240 then causes signals VC to indicate a first phase difference PD1 between signals CA1 and CC4 that indicates the delay from node A to node C via nodes B and G. The first phase difference PD1 is stored in control circuit 242.

Control circuit 242 then measures the delay from node E to node C through circuits 422, 412, 213, 232, 234, and 236. During the measurement of the delay from node E to node C, multiplexer circuit 422 is configured by select signals S4 to generate signal CI1 at its output based on the signal CE1 at its second multiplexing input at node E. Multiplexer circuit 422 buffers signal CE1 to generate signal CI1. Buffer circuit 412 buffers signal CI1 to generate signal CI2. Multiplexer circuit 213 is configured by select signals S2 to generate signal CC1 based on signal CI2 during the measurement of the delay from node E to node C. Buffer circuits 232, 234, and 236 generate signal CC4 based on signal CC1, as described above. Phase detection circuit 240 then causes signals VC to indicate a second phase difference PD2 between signals CA1 and CC4 that indicates the delay from node E to node C. The second phase difference PD2 is stored in control circuit 242. Control circuit 242 then calculates the phase PCE1 of signal CE1 relative to the phase of signal CA1 using, for example, the equation PCE1=PD2−(PD1÷2). Alternatively, control circuit 242 calculates the phase PCE1 of signal CE1 using the equation PCE1=PD2−(PD1÷2)+PCA1.

Signal CE2 is also provided to an input of control circuit 242 through a conductor. Control circuit 242 determines the phase of signal CE2. Control circuit 242 then subtracts the phase of signal CE2 from the phase of signal CE1 to determine the phase difference between signals CE2 and CE1. If the delay of signal network 404 is less than a period of signal CE1, then the phase difference between signals CE1 and CE2 equals the delay that signal network 404 provides to signal CE2 relative to signal CE1. Control circuit 242 may, for example, determine the phase of signal CE2 using a phase detector.

In order to determine the delay that signal network 404 provides to signal CE4 relative to signal CE3, signal CA1 is set to have the same frequency as signal CE3 in some embodiments, and measurement circuit 400 determines the phase of signal CE3 relative to the phase of signal CA1. To determine the phase of signal CE3 relative to the phase of signal CA1, measurement circuit 400 generates a first phase difference PD1 that indicates the round trip delay from node A to node C via node B and node G through circuits 211, 221-223, 410, and 420, as described above.

Measurement circuit 400 then measures the delay from node X to node C through circuits 422, 412, 213, 232, 234, and 236. During the measurement of the delay from node X to node C, multiplexer circuit 422 is configured by select signals S4 to generate signal CI1 at its output based on the signal CE3 at its third multiplexing input at node X. Multiplexer circuit 422 buffers signal CE3 to generate signal CI1. Buffer circuit 412 buffers signal CI1 to generate signal CI2. During the measurement of the delay from node X to node C, multiplexer circuit 213 is configured by select signals S2 to generate signal CC1 based on signal CI2, and buffer circuits 232, 234, and 236 generate signal CC4 based on signal CC1, as described above. Phase detection circuit 240 then causes signals VC to indicate a second phase difference PD2 between signals CA1 and CC4 that indicates the delay from node X to node C. The second phase difference PD2 is stored in control circuit 242. Control circuit 242 then calculates the phase PCE3 of signal CE3 relative to the phase of signal CA1 using, for example, the equation PCE3=PD2−(PD1÷2) or the equation PCE3=PD2−(PD1÷2)+PCA1.

Signal CE4 is also provided to an input of control circuit 242 through a conductor. Control circuit 242 determines the phase of signal CE4. Control circuit 242 may, for example, determine the phase of signal CE4 using a phase detector. Control circuit 242 then subtracts the phase of signal CE4 from the phase of signal CE3 to determine the phase difference between signals CE4 and CE3. If the delay of signal network 404 is less than a period of signal CE3, then the phase difference between signals CE3 and CE4 equals the delay that signal network 404 provides to signal CE4 relative to signal CE3. According to additional embodiments, multiplexer circuit 422 may have five or more multiplexing inputs that receive one or more additional measured signals. The additional measured signals may be received, for example, from the second data channel.

In order to determine the delay that signal network 405 provides to signal CF2 relative to signal CF1, signal CA1 is set to have the same frequency as signal CF1 in some embodiments, and measurement circuit 400 determines the phase of signal CF1 relative to the phase of signal CA1. To determine the phase of signal CF1 relative to the phase of signal CA1, control circuit 242 measures the round trip delay from node A to node C via node B, node G, and node H through circuits 211, 221-223, 410, 420, 415, and 425.

Circuits 211, 221-223, 410, 420, 415, and 425 ideally provide a symmetric delay to signal CC4 relative to signal CA1, such that one-half of the delay from node A to node C via nodes B, G, and H equals or approximately equals the delay from node F to node C. In some embodiments, multiplexer circuit 423 has the same architecture and the same size transistors as multiplexer circuit 424, and buffer circuit 413 has the same architecture and the same size transistors as buffer circuit 414. In some embodiments, circuits 413 and 423 are located next to or near circuits 414 and 424 within circuits 415 and 425, respectively. In some embodiments, circuits 211, 221-223, 410, 420, 415, and 425 are in the same integrated circuit.

During the measurement of the delay from node A to node C via nodes B, G, and H, multiplexer circuit 421 is configured by select signal S3 to generate signal CA7 at its output based on signal CA6. Buffer circuit 413 buffers signal CA7 to generate signal CA8 at its output, and multiplexer circuit 423 is configured by select signal S5 to buffer signal CA8 to generate signal CA9 at its output.

Signal CA9 at node H is provided to a first multiplexing input of multiplexer circuit 424. Multiplexer circuit 424 is configured by select signals S6 to generate signal CH1 at its output based on signal CA9 during the measurement of the delay from node A to node C via nodes B, G, and H. Multiplexer circuit 424 buffers signal CA9 to generate signal CH1. Buffer circuit 414 buffers signal CH1 to generate signal CH2 at its output. Signal CH2 is provided to the fourth multiplexing input of multiplexer circuit 422. During the measurement of the delay from node A to node C via nodes B, G, and H, multiplexer circuit 422 is configured by select signals S4 to generate signal CI1 based on signal CH2. Multiplexer circuit 422 buffers signal CH2 to generate signal CI1. Buffer circuit 412 buffers signal CI1 to generate signal CI2. Multiplexer circuit 213 is configured by select signals S2 to generate signal CC1 based on signal CI2. Buffer circuits 232, 234, and 236 generate signal CC4 based on signal CC1, as described above. Thus, signal CC4 is generated based on signal CA9 during the measurement of the delay from node A to node C via nodes B, G, and H. Phase detection circuit 240 causes signals VC to indicate a first phase difference PD1 between signals CA1 and CC4 that indicates the delay from node A to node C via nodes B, G, and H. The first phase difference PD1 is stored in control circuit 242.

Control circuit 242 then measures the delay from node F to node C through circuits 424, 414, 422, 412, 213, 232, 234, and 236. During the measurement of the delay from node F to node C, multiplexer circuit 424 is configured by select signals S6 to generate signal CH1 at its output based on the signal CF1 at its second multiplexing input at node F. Multiplexer circuit 424 buffers signal CF1 to generate signal CH1. Buffer circuit 414 buffers signal CH1 to generate signal CH2. During the measurement of the delay from node F to node C, multiplexer circuit 422 is configured by select signals S4 to generate signal CI1 based on signal CH2. Multiplexer circuit 422 buffers signal CH2 to generate signal CI1. Buffer circuit 412 buffers signal CI1 to generate signal CI2. Multiplexer circuit 213 is configured by select signals S2 to generate signal CC1 based on signal C12. Buffer circuits 232, 234, and 236 generate signal CC4 based on signal CC1, as described above. Thus, signal CC4 is generated based on signal CF1 during the measurement of the delay from node F to node C.

Phase detection circuit 240 then causes signals VC to indicate a second phase difference PD2 between signals CA1 and CC4 that indicates the delay from node F to node C. The second phase difference PD2 is stored in control circuit 242. Control circuit 242 then calculates the phase PCF1 of signal CF1 relative to the phase of signal CA1 using, for example, the equation PCF1=PD2−(PD1÷2). Alternatively, control circuit 242 calculates the phase PCF1 of signal CF1 using the equation PCF1=PD2−(PD1÷2)+PCA1.

Signal CF2 is also provided to an input of control circuit 242 through a conductor. Control circuit 242 determines the phase of signal CF2. Control circuit 242 may, for example, determine the phase of signal CF2 using a phase detector. Control circuit 242 then subtracts the phase of signal CF2 from the phase of signal CF1 to determine the phase difference between signals CF2 and CF1. If the delay of signal network 405 is less than a period of signal CF1, then the phase difference between signals CF1 and CF2 equals the delay that signal network 405 provides to signal CF2 relative to signal CF1.

In order to determine the delay that signal network 405 provides to signal CF4 relative to signal CF3, signal CA1 is set to have the same frequency as signal CF3 in some embodiments, and measurement circuit 400 determines the phase of signal CF3 relative to the phase of signal CA1. To determine the phase of signal CF3 relative to the phase of signal CA1, measurement circuit 400 generates a first phase difference PD1 that indicates the round trip delay from node A to node C via node B, node G, and node H through circuits 211, 221-223, 410, 420, 415, and 425, as described above.

Measurement circuit 400 then measures the delay from node Y to node C through circuits 424, 414, 422, 412, 213, 232, 234, and 236. During the measurement of the delay from node Y to node C, multiplexer circuit 424 is configured by select signals S6 to generate signal CH1 at its output based on the signal CF3 at its third multiplexing input at node Y. Multiplexer circuit 424 buffers signal CF3 to generate signal CH1. Buffer circuit 414 buffers signal CH1 to generate signal CH2. During the measurement of the delay from node Y to node C, multiplexer circuit 422 is configured by select signals S4 to generate signal CI1 based on signal CH2. Multiplexer circuit 422 buffers signal CH2 to generate signal CI1. Buffer circuit 412 buffers signal CI1 to generate signal CI2. During the measurement of the delay from node Y to node C, multiplexer circuit 213 is configured by select signals S2 to generate signal CC1 based on signal CI2, and buffer circuits 232, 234, and 236 generate signal CC4 based on signal CC1, as described above. Thus, signal CC4 is generated based on signal CF3 during the measurement of the delay from node Y to node C.

Phase detection circuit 240 then causes signals VC to indicate a second phase difference PD2 between signals CA1 and CC4 that indicates the delay from node Y to node C. The second phase difference PD2 is stored in control circuit 242. Control circuit 242 then calculates the phase PCF3 of signal CF3 relative to the phase of signal CA1 using, for example, the equation PCF3=PD2−(PD1÷2) or the equation PCF3=PD2−(PD1÷2)+PCA1.

Signal CF4 is also provided to an input of control circuit 242 through a conductor. Control circuit 242 determines the phase of signal CF4. Control circuit 242 may, for example, determine the phase of signal CF4 using a phase detector. Control circuit 242 then subtracts the phase of signal CF4 from the phase of signal CF3 to determine the phase difference between signals CF4 and CF3. If the delay of signal network 405 is less than a period of signal CF3, then the phase difference between signals CF4 and CF3 equals the delay that signal network 405 provides to signal CF4 relative to signal CF3. According to additional embodiments, multiplexer circuit 424 may have five or more multiplexing inputs that receive one or more additional measured signals. The additional measured signals may be received, for example, from the third data channel.

Measurement circuit 400 can measure the phases of one or more additional signals in one or more additional channels. For example, additional buffer and multiplexer circuits can be coupled to circuit 425 to extend the delay circuitry of FIG. 4, and signal CA9 can be provided through the additional buffers and multiplexers to generate signal CG1 during a measurement of the round trip delay through the delay circuitry. During the measurement of the delay from the additional channel to phase detection circuit 240, a signal generated in the additional channel is provided through the delay circuitry to circuit 424 as signal CG1. Signal CG1 is provided to a fourth multiplexing input of multiplexer circuit 424. Multiplexer circuit 424 is configured by select signals S6 to generate signal CH1 based on signal CG1 during these measurements. A signal delayed by an additional signal network is provided to control circuit 242 for determining the delay from the additional channel through the additional signal network. According to an alternative embodiment, buffer circuits 413-414 and multiplexer circuits 423-424 can be eliminated from measurement circuit 400, such that the measurement circuit only measures delays of two signal networks 202 and 404.

Figure 5:
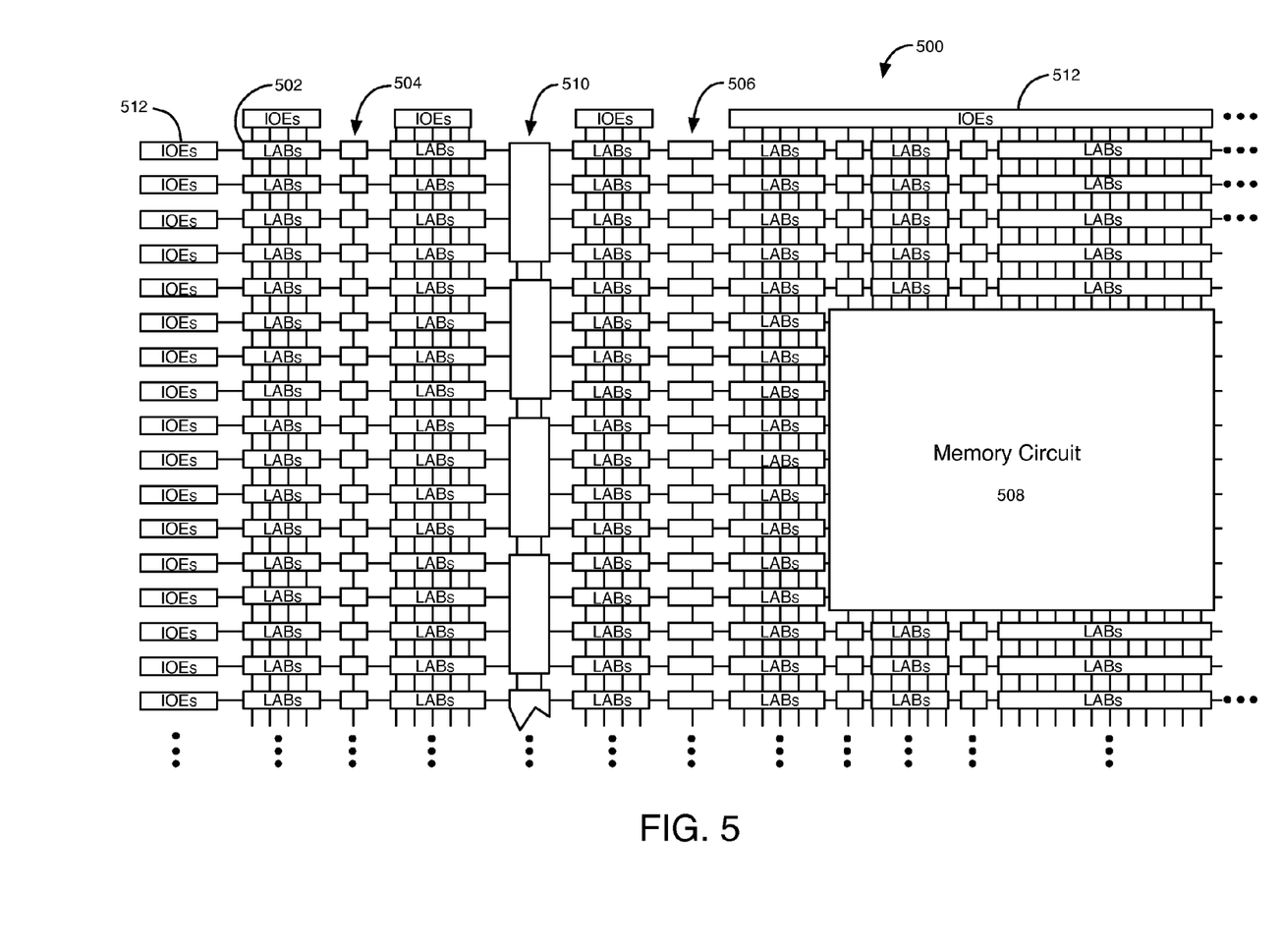
FIG. 5 is a simplified partial block diagram of a field programmable gate array (FPGA) that can include aspects of the present invention.

FIG. 5 is a simplified partial block diagram of a field programmable gate array (FPGA) 500 that can include aspects of the present invention. FPGA 500 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 500 includes an array of programmable logic array blocks (or LABs) 502 that are interconnected by a signal network of column and row interconnect conductors of varying length and speed. LABs 502 include multiple (e.g., 10) logic elements (or LEs).

A logic element (LE) is a programmable logic circuit that provides for efficient implementation of user defined logic functions. An FPGA has numerous logic elements that can be configured to implement various combinatorial and sequential functions. The logic elements have access to a programmable interconnect structure of signal networks. The programmable interconnect structure can be programmed to interconnect the logic elements in almost any desired configuration.

FPGA 500 may also include a distributed memory structure including random access memory (RAM) circuits of varying sizes provided throughout the array. The RAM circuits may include, for example, circuits 504, circuits 506, and circuit 508 as shown in FIG. 5. These memory circuits can also include shift registers and first-in-first-out (FIFO) buffers.

FPGA 500 may also include digital signal processing (DSP) circuits 510 as shown in FIG. 5 that can implement, for example, multipliers with add or subtract features. Input/ output elements (IOEs) 512 support numerous single-ended and differential input/output standards. IOEs 512 include input and output buffers that are coupled to pads of the integrated circuit. The pads are external terminals of the FPGA die that can be used to route, for example, input signals, output signals, and supply voltages between the FPGA and one or more external devices. FPGA 500 may also include the circuits shown in FIGS. 1A, 2 and 4. FPGA 500 is described herein for illustrative purposes. Embodiments of the present invention can be implemented in many different types of integrated circuits.

Figure 6:
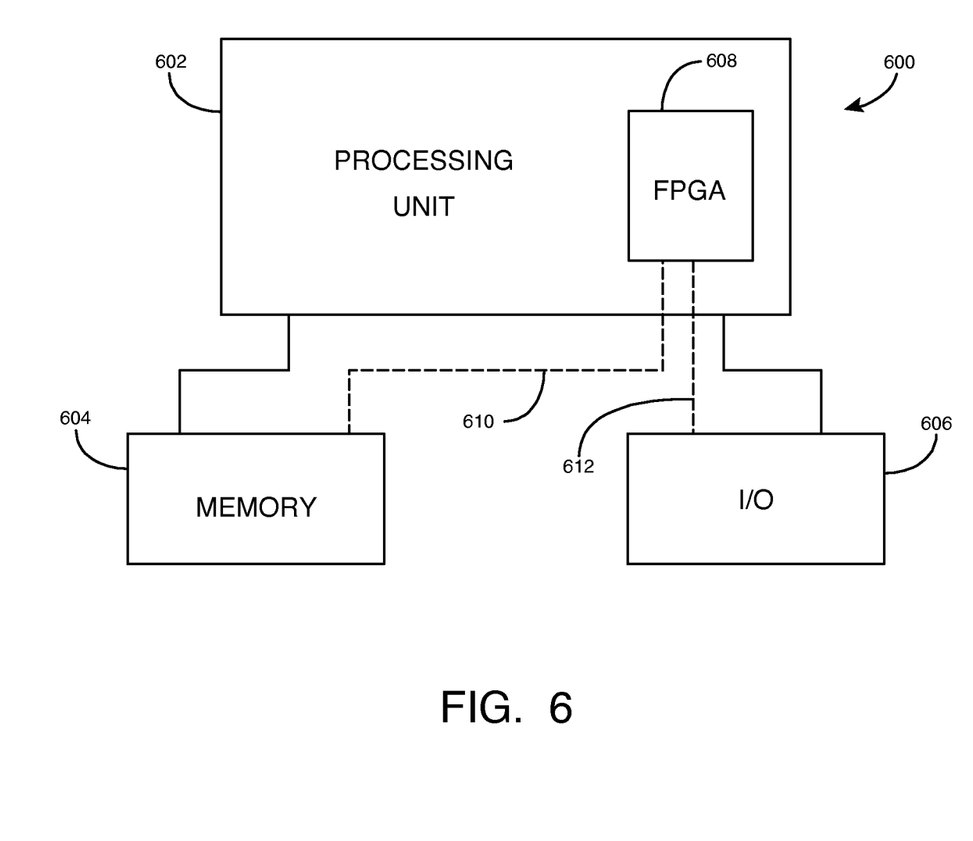
FIG. 6 shows a block diagram of an exemplary digital system that can embody techniques of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604, and an input/output (I/O) unit 606 interconnected together by one or more buses. According to this exemplary embodiment, an FPGA 608 is embedded in processing unit 602. FPGA 608 can serve many different purposes within the system of FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604, receive and transmit data via I/O unit 606, or other similar functions. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor that can be reprogrammed as needed to handle a particular computing task. Alternatively, FPGA 608 can itself include an embedded microprocessor. Memory unit 604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A measurement circuit comprising:
    delay circuitry coupled to a first signal network; and
    a phase detection circuit coupled to the delay circuitry to compare a first signal to a second signal to generate a first phase difference when the delay circuitry generates the second signal based on the first signal,
    wherein the phase detection circuit compares the first signal to the second signal to generate a second phase difference when the delay circuitry generates the second signal based on a third signal provided to the first signal network, and wherein the measurement circuit determines a delay of the first signal network based on the first and second phase differences.

2. The measurement circuit of claim 1, wherein a delay that the delay circuitry provides to the second signal relative to the first signal when the delay circuitry generates the second signal based on the first signal is substantially equal to one-half of a delay that the delay circuitry provides to the second signal relative to the third signal when the delay circuitry generates the second signal based on the third signal.

3. The measurement circuit of claim 1, wherein the delay circuitry comprises a first multiplexer circuit to cause the delay circuitry to generate the second signal based on the first signal while the phase detection circuit generates the first phase difference, and wherein the first multiplexer circuit causes the delay circuitry to generate the second signal based on the third signal while the phase detection circuit generates the second phase difference.

4. The measurement circuit of claim 3, wherein the delay circuitry comprises a first portion and a second portion, wherein the first portion of the delay circuitry receives the first signal, wherein the second portion of the delay circuitry generates the second signal and receives the third signal, wherein the second portion of the delay circuitry comprises the first multiplexer circuit, and wherein the first and second portions of the delay circuitry have symmetric delays.

5. The measurement circuit of claim 3, wherein the delay circuitry further comprises a second multiplexer circuit, wherein the phase detection circuit compares the first signal to the second signal to generate a third phase difference when the first and second multiplexer circuits cause the delay circuitry to generate the second signal based on a fourth signal provided to a second signal network, and wherein the measurement circuit determines a delay of the second signal network based on the third phase difference.

6. The measurement circuit of claim 5, wherein the fourth signal is generated independently of the first signal.

7. The measurement circuit of claim 5, wherein the delay circuitry further comprises a third multiplexer circuit, wherein the phase detection circuit compares the first signal to the second signal to generate a fourth phase difference when the first, second, and third multiplexer circuits cause the delay circuitry to generate the second signal based on a fifth signal provided to a third signal network, and wherein the measurement circuit determines a delay of the third signal network based on the fourth phase difference.

8. The measurement circuit of claim 1 further comprising:
    a control circuit coupled to the phase detection circuit to determine a phase of the third signal based on the first and second phase differences, wherein the control circuit determines the delay of the first signal network based on the phase of the third signal.

9. The measurement circuit of claim 1, wherein the third signal is generated independently of the first signal.

10. A circuit comprising:
    delay circuitry that comprises a first multiplexer circuit;
    a phase detection circuit coupled to the delay circuitry to compare a phase of a first signal to a phase of a second signal to generate a first phase difference when the first multiplexer circuit causes the delay circuitry to generate the second signal based on the first signal, wherein the phase detection circuit compares a phase of the first signal to a phase of the second signal to generate a second phase difference when the first multiplexer circuit causes the delay circuitry to generate the second signal based on a third signal; and
    a control circuit coupled to the phase detection circuit to determine a phase of the third signal based on the first and second phase differences.

11. The circuit of claim 10, wherein the phase detection circuit receives the first signal at a first node, wherein the phase detection circuit receives the second signal at a second node, wherein the delay circuitry receives the third signal at a third node, and wherein a first delay through the delay circuitry from the first node to the second node is substantially equal to two times a second delay through the delay circuitry from the third node to the second node.

12. The circuit of claim 10, wherein the delay circuitry further comprises first buffer circuits to generate a fourth signal based on the first signal, a second multiplexer circuit to generate a fifth signal based on the fourth signal, and second buffer circuits to generate the second signal based on a sixth signal generated by the first multiplexer circuit, wherein the fifth signal is provided to a first multiplexing input of the first multiplexer circuit, and wherein the third signal is provided to a second multiplexing input of the first multiplexer circuit.

13. The circuit of claim 10, wherein the phase detection circuit generates the first and second phase differences when the first signal is generated based on the third signal, and wherein the third signal is generated independently of the first signal.

14. The circuit of claim 10, wherein the delay circuitry further comprises a second multiplexer circuit, wherein the phase detection circuit compares a phase of the first signal to a phase of the second signal to generate a third phase difference when the first and second multiplexer circuits cause the delay circuitry to generate the second signal based on the first signal,
    wherein the phase detection circuit compares a phase of the first signal to a phase of the second signal to generate a fourth phase difference when the first and second multiplexer circuits cause the delay circuitry to generate the second signal based on a fourth signal, and wherein the control circuit determines a phase of the fourth signal based on the third and fourth phase differences.

15. The circuit of claim 14, wherein the delay circuitry further comprises a third multiplexer circuit, wherein the phase detection circuit compares a phase of the first signal to a phase of the second signal to generate a fifth phase difference when the first, second, and third multiplexer circuits cause the delay circuitry to generate the second signal based on the first signal,
    wherein the phase detection circuit compares a phase of the first signal to a phase of the second signal to generate a sixth phase difference when the first, second, and third multiplexer circuits cause the delay circuitry to generate the second signal based on a fifth signal, and wherein the control circuit determines a phase of the fifth signal based on the fifth and sixth phase differences.

16. The circuit of claim 10, wherein the phase detection circuit compares a phase of the first signal to a phase of the second signal to generate a third phase difference when the first multiplexer circuit causes the delay circuitry to generate the second signal based on a fourth signal, wherein the control circuit determines a phase of the fourth signal based on the third phase difference, and wherein the fourth signal is generated independently of the first signal.

17. A method comprising:
    comparing a first signal to a second signal using a phase detection circuit to generate a first phase difference when delay circuitry generates the second signal based on the first signal, wherein the delay circuitry is coupled to the phase detection circuit;
    comparing the first signal to the second signal using the phase detection circuit to generate a second phase difference when the delay circuitry generates the second signal based on a third signal that is provided to a first signal network; and
    determining a delay of the first signal network based on the first and second phase differences using a control circuit.

18. The method of claim 17 further comprising:
    causing the delay circuitry to generate the second signal based on the first signal using a first multiplexer circuit in the delay circuitry while the phase detection circuit generates the first phase difference; and
    causing the delay circuitry to generate the second signal based on the third signal using the first multiplexer circuit while the phase detection circuit generates the second phase difference.

19. The method of claim 18, wherein a delay that the delay circuitry provides to the second signal relative to the first signal when the delay circuitry generates the second signal based on the first signal is substantially equal to one-half of a delay that the delay circuitry provides to the second signal relative to the third signal when the delay circuitry generates the second signal based on the third signal.

20. The method of claim 18 further comprising:
    comparing the first signal to the second signal to generate a third phase difference using the phase detection circuit when the first multiplexer circuit and a second multiplexer circuit in the delay circuitry cause the delay circuitry to generate the second signal based on a fourth signal that is provided to a second signal network; and
    determining a delay of the second signal network based on the third phase difference using the control circuit.

21. The method of claim 20 further comprising:
    comparing the first signal to the second signal to generate a fourth phase difference using the phase detection circuit when the first and second multiplexer circuits and a third multiplexer circuit in the delay circuitry cause the delay circuitry to generate the second signal based on a fifth signal provided to a third signal network; and
    determining a delay of the third signal network based on the fourth phase difference using the control circuit.

* * * * *